United States Patent
Heiderman et al.

(10) Patent No.: US 9,257,286 B2
(45) Date of Patent: Feb. 9, 2016

(54) SUPPLY SOURCE AND METHOD FOR ENRICHED SELENIUM ION IMPLANTATION

(71) Applicants: Douglas C. Heiderman, Akron, NY (US); Ashwini K. Sinha, East Amherst, NY (US); Lloyd A. Brown, Amherst, NY (US)

(72) Inventors: Douglas C. Heiderman, Akron, NY (US); Ashwini K. Sinha, East Amherst, NY (US); Lloyd A. Brown, Amherst, NY (US)

(73) Assignee: Praxair Technology, Inc., Danbury, CT (US)

( * ) Notice: Subject to any disclaimer, the term of this patent is extended or adjusted under 35 U.S.C. 154(b) by 27 days.

(21) Appl. No.: 14/267,390

(22) Filed: May 1, 2014

(65) Prior Publication Data

US 2014/0329377 A1    Nov. 6, 2014

Related U.S. Application Data

(60) Provisional application No. 61/818,706, filed on May 2, 2013.

(51) Int. Cl.
| | |
|---|---|
| H01L 21/265 | (2006.01) |
| C23C 14/00 | (2006.01) |
| F17C 1/00 | (2006.01) |
| H01J 37/317 | (2006.01) |

(52) U.S. Cl.
CPC ............ H01L 21/265 (2013.01); C23C 14/00 (2013.01); F17C 1/00 (2013.01); H01J 37/3171 (2013.01); *H01J 2237/08* (2013.01); *Y10T 137/7781* (2015.04)

(58) Field of Classification Search
CPC ............... H01L 21/265; H01L 21/425; H01L 21/26506; H01L 21/02579
See application file for complete search history.

(56) References Cited

U.S. PATENT DOCUMENTS

| | | | |
|---|---|---|---|
| 5,937,895 A | 8/1999 | LeFebre et al. | |
| 6,007,609 A | 12/1999 | Semerdjian et al. | |
| 6,045,115 A | 4/2000 | Martin, Jr. et al. | |
| 6,132,492 A | 10/2000 | Hultquist et al. | |
| 7,404,845 B2 * | 7/2008 | Tempel ................ | C01B 3/001 252/183.11 |
| 7,708,028 B2 | 5/2010 | Brown et al. | |
| 7,905,247 B2 | 3/2011 | Campeau | |
| 2004/0206241 A1 | 10/2004 | Tempel et al. | |
| 2006/0060818 A1 | 3/2006 | Tempel et al. | |

FOREIGN PATENT DOCUMENTS

WO    WO 2007134183 A2    11/2007

OTHER PUBLICATIONS

Rao et al. "NMOS Contact Resistance Reduction withSelenium Implant into NiPt Silicide". Proceedings of the 19 Int'l Conf. on Ion Implantation Technology. AIP Conference Proceedings, vol. 1496, pp. 46-49 (2012).

(Continued)

Primary Examiner — Kyoung Lee
(74) Attorney, Agent, or Firm — Nilay S. Dalal

(57) ABSTRACT

A novel method for ion implanting isotopically enriched selenium containing source material is provided. The source material is selected and enriched in a specific mass isotope of selenium, whereby the enrichment is above natural abundance levels. The inventive method allows reduced gas consumption and reduced waste. The source material is preferably stored and delivered from a sub-atmospheric storage and delivery device to enhance safety and reliability during the selenium ion implantation process.

22 Claims, 5 Drawing Sheets

Schematic of an ion source apparatus

(56) References Cited

OTHER PUBLICATIONS

Tcheltsov A.N. et al. "Centrifugal enrichment of selenium isotopes and their application to the development of new technologies and to the experiments on physics of weak interaction", Nuclear Instruments & Methods in Physics Research. Section A: Accelerators, Spectrometers, Detectors, and Associated Equipment, Elsevier BV * North-Holland, NL, vol. 521, No. 1, Mar. 21, 2004, pp. 156-160, XP004498289, ISSN: 0168-9002,DOI: 10.1016/J.NIMA.2003.11.383 section "3. Separation of selenium isotopes".

* cited by examiner

Schematic of an ion source apparatus

Deposits during H₂Se Implant

Filament current trend during SiF4 implant

Deposits during enriched SeF$_6$ implant

SUPPLY SOURCE AND METHOD FOR ENRICHED SELENIUM ION IMPLANTATION

RELATED APPLICATIONS

This application claims the benefit of priority to U.S. provisional application Ser. No. 61/818,706 filed on May 2, 2013, the disclosure of which is incorporated by reference herein in its entirety.

FIELD OF THE INVENTION

The present invention relates to a method and system for improving ion source performance during selenium ion implantation.

BACKGROUND OF THE INVENTION

Ion implantation is an important process in semiconductor/microelectronic manufacturing. The ion implantation process is used in integrated circuit fabrication to introduce dopant impurities into semiconductor wafers. Generally speaking, with respect to semiconductor applications, ion implantation involves the introduction of ions from a dopant species, also commonly referred to as dopant impurities, into a semiconductor substrate material in order to change the substrate material's physical, chemical and/or electrical characteristics. The desired dopant impurities are introduced into semiconductor wafers to form doped regions at a desired depth. The dopant impurities are selected to bond with the semiconductor wafer material to create electrical carriers and thereby alter the electrical conductivity of the semiconductor wafer material. The concentration of dopant impurities introduced determines the electrical conductivity of the doped region. Many impurity regions are necessarily created to form transistor structures, isolation structures and other electronic structures, which collectively function as a semiconductor device.

An ion source is used to generate a well-defined ion beam of ion species from the dopant species. The ion source is a critical component of the ion implantation system, which serves to ionize dopant species that are to be implanted during the implantation process. The dopant ions are generally derived from a source dopant species. The ion-source generates a defined ion beam for a variety of ion species derived from a source dopant gas. The ion source can be a filament or cathode made of tungsten (W) or tungsten alloy. Current is applied to the filament to ionize the source dopant species within an ion implanter. The source dopant species dissociates into corresponding ionic species, which is thereafter implanted into a given substrate.

Current semiconductor device technology utilizes a variety of dopant species. In specific applications, implantation of selenium (Se) ions into specific sections or regions of the semiconductor wafer has emerged as a widely used dopant introduction method to enhance device function. For example, Se implantation onto silicide contacts is reported to reduce the contact resistance in nMOS devices and improve its performance.

Today, the industry utilizes Se-containing solid sources in the form of Se metal or SeO2 for ion implantation. However, numerous process challenges currently exist for effective implantation of Se ions utilizing Se-containing solid sources. In particular, the solid sources require a vaporizer assembly and sufficient heating of the solid to generate Se containing vapors with sufficient vapor pressure to allow transport of the vapors to the ion-source assembly. However, the solid sources exhibit poor flow control that prevents stable operation. Additionally, adequate start-up time is required for the vaporizer assembly to be heated to the desired temperature before the user can start the Se implant process. Similarly, downtime must be allowed and taken into consideration for sufficient cool down to occur upon completion of the Se implant process. The extended time requirements when utilizing solid sources can result in significant productivity losses.

In view of the problems associated with solid precursors, Se-containing gas sources have been utilized. H2Se is a commonly known gas source for Se implant. However, the applicants observed that utilizing H2Se produces Se containing deposits inside the ion implantation equipment that can result in short ion source life. As a result, ion source maintenance is required at very frequent intervals, which results in ion implanter down-time and reduced production time.

As an alternative, SeO2 has been utilized. However, the presence of oxygen can lead to oxygen poisoning, which can lead to limited or shortened source life during selenium ion implantation.

Furthermore, Se precursor dopant materials are toxic to humans and therefore handling of Se precursor materials must be performed carefully to prevent exposure via contact or inhalation. Many of the precursor Se dopant materials used for the supply of Se species to be ionized in the ion source are toxic. The handling of such materials must be done carefully to prevent exposure and minimizing the quantity of such materials to be handled is valuable.

There currently is no viable dopant source to perform Se ion implantation given its shortcomings. Accordingly, there is an unmet need to extend the time between maintenance cycles for the ion source as well as to limit the quantity of Se dopant material that is required to allow for ion implantation in a safe and reliable manner during Se ion implantation.

SUMMARY OF THE INVENTION

The invention may include any of the following aspects in various combinations and may also include any other aspect described below in the written description or in the attached drawings.

In a first aspect, a method for implanting selenium, is provided, comprising: selecting an enriched selenium-based dopant precursor material, said material having a plurality of selenium mass isotopes; selecting a specific selenium mass isotope from the plurality of selenium mass isotopes, said specific selenium mass isotope contained in the precursor material at an enrichment level above natural abundance levels; providing the enriched selenium-based dopant precursor material in a storage and delivery container, said container being compatible with the selected enriched selenium-based dopant precursor; withdrawing the enriched selenium-based dopant precursor material in a gaseous phase from the storage and delivery container; flowing the material at a predetermined flow to an ion source; ionizing the enriched selenium-based dopant precursor material to produce ions of the specific selenium mass isotope; extracting the ionized specific selenium mass isotope from the ion source; and implanting the ionized specific selenium mass isotope into a substrate; wherein the specific selenium mass isotope is enriched to a concentration greater than a concentration of the specific selenium mass isotope in a corresponding natural abundance selenium dopant precursor material, thereby allowing the predetermined flow rate of the enriched selenium-based dopant precursor material to be less than a corresponding flow rate of a natural abundance selenium-based dopant precursor material.

In a second aspect, a source supply for a selenium-based dopant gas composition is provided comprising a gaseous selenium dopant containing gas source material enriched in one of its naturally occurring mass isotopes; and a sub-atmospheric delivery and storage device for maintaining the enriched selenium dopant containing gas source material in a pressurized state within an interior volume of the device, said delivery device in fluid communication with a discharge flow path, wherein said delivery device is actuated to allow a controlled flow of the enriched selenium dopant containing gas source material from the interior volume of the device in response to a sub-atmospheric condition achieved along the discharge flow path.

In a third aspect, a selenium-containing dopant composition for use in an ion implantation process is provided comprising a selenium-containing dopant gas source material enriched in one of its naturally occurring mass isotopes to a concentration greater than a concentration of the specific selenium mass isotope in a corresponding natural abundance selenium dopant precursor material, wherein said selenium-containing material is stored and delivered in the gas phase, thereby characterized by an absence of storage and delivery from a vaporizer.

Advantageously, the system of the present invention can be constructed utilizing system components that are commercially available, thus enabling and simplifying the overall assembly of the system and method of use thereof. Aspects of the ion implantation process can be carried out using standard techniques or equipment.

BRIEF DESCRIPTION OF THE DRAWINGS

The objectives and advantages of the invention will be better understood from the following detailed description of the preferred embodiments thereof in connection with the accompanying figures wherein like numbers denote same features throughout and wherein.

DETAILED DESCRIPTION OF THE INVENTION

The relationship and functioning of the various elements of this invention are better understood by the following detailed description. The detailed description contemplates the features, aspects and embodiments in various permutations and combinations, as being within the scope of the disclosure. The disclosure may therefore be specified as comprising, consisting or consisting essentially of, any of such combinations and permutations of these specific features, aspects, and embodiments, or a selected one or ones thereof.

As used herein, unless indicated otherwise, all concentrations are expressed as volumetric percentages ("vol %").

The present invention recognizes that by minimizing the quantity of Se precursor material that must be introduced to the ion source for implantation, the ion source tool productivity can be increased. The present invention involves the isotopic enrichment of any one of the six mass levels of Se above its natural abundance levels (shown in Table 1 below) up to and including 99.99% abundance of a particular mass isotope.

TABLE 1

| Selenium mass | Natural abundance (%) |
|---|---|
| 74 | 0.87 |
| 76 | 9.02 |
| 77 | 7.58 |
| 78 | 23.52 |
| 80 | 49.82 |
| 82 | 9.19 |

As used herein and throughout the specification, the terms "isotopically enriched" and "enriched" dopant species are used interchangeably to mean the dopant species contains a distribution of mass isotopes that is different from the naturally occurring isotopic distribution, whereby one of the mass isotopes has an enrichment level higher than present in the naturally occurring level. By way of example, 60% $^{80}$Se refers to an isotopically enriched or enriched dopant species containing mass isotope $^{80}$Se at 60% enrichment, whereas naturally occurring $^{80}$Se contains mass isotope $^{80}$Se at 49.82% natural abundance levels.

The enriched selenium ions can be derived from various dopant species precursor materials, including, but not limited to, selenium metal, selenium dioxide, selenium trioxide, selenium hexafluoride, and hydrogen selenide. The preferred method of delivery of isotopically enriched selenium material is in the gas phase, utilizing a precursor material such as enriched hydrogen selenide, or, more preferably, enriched selenium hexafluoride. However, it should be understood that the enrichment is not limited to gaseous material. Solid sources such as selenium metal, selenium dioxide and selenium trioxide can also be provided at various isotopically enriched levels.

The present invention contemplates enriching any mass isotope of Se to any enrichment value up to and including 100%. In one embodiment, $^{80}$Se, which is naturally occurring in amounts of 49.92% abundance, could be enriched from 50-60%. In another embodiment, the enrichment level may range from 60-70%, 70-80%, 80-90% or 90-100%.

Figure 1:
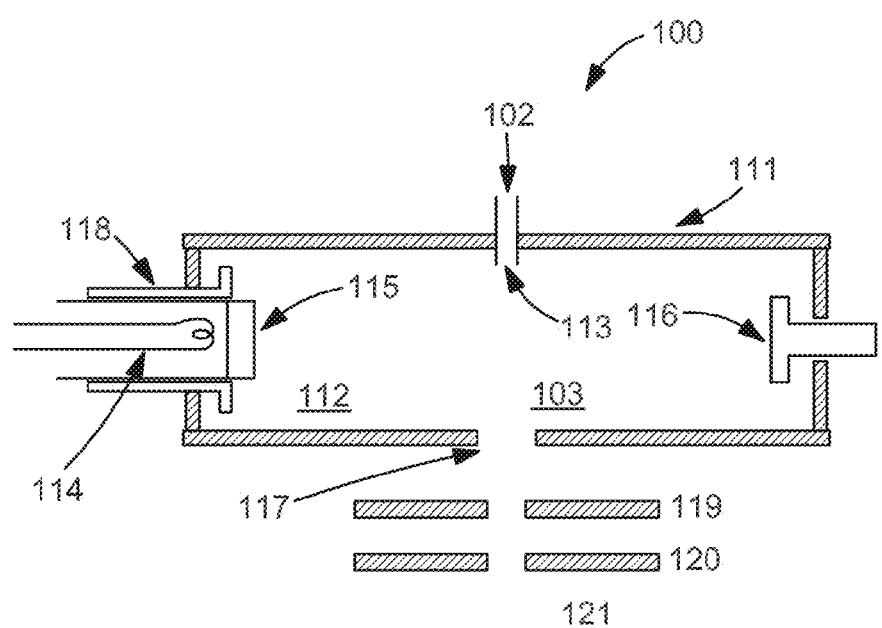
FIG. 1 shows an ion implanter incorporating the principles of the invention.
Figure 2:
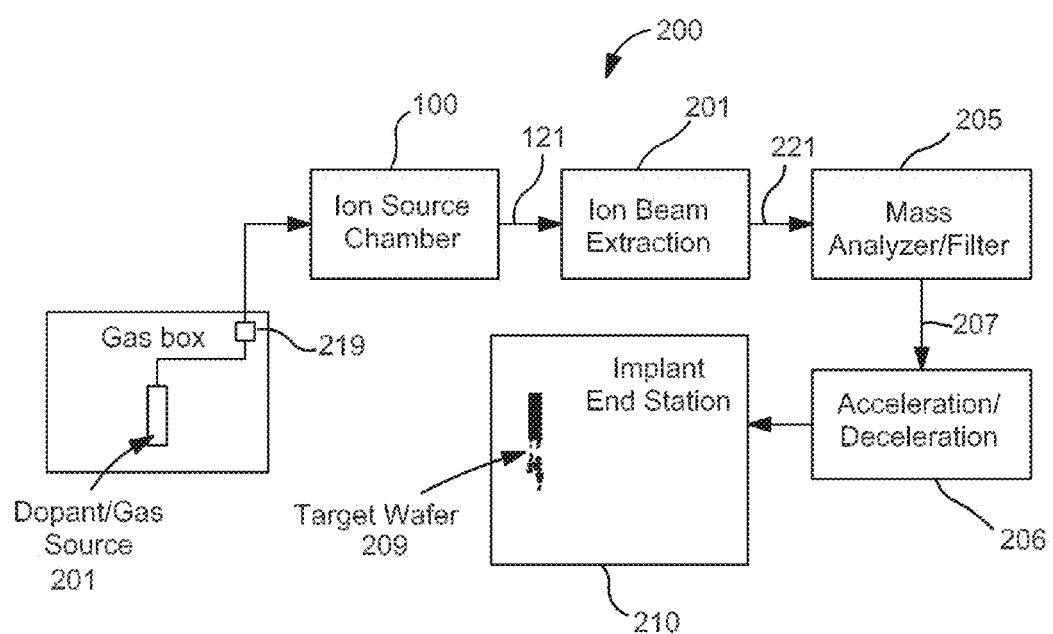
FIG. 2 shows the ion implanter of FIG. 1 within an implant system.

With reference to FIGS. 1 and 2, an exemplary ion implantation apparatus 100 in accordance with the principles of the present invention is shown. Specifically, in one example, the ion source apparatus 100 of FIG. 1 can be used for producing an electron beam for implanting Se ions which are isotopically enriched above natural abundance levels in one of its stable mass isotopes 74, 76, 77, 78, 80 or 82. An enriched selenium-based dopant precursor material is selected. The Se-based dopant material can be selected from any number of suitable precursors, such as for example, selenium metal, selenium dioxide, selenium trioxide, selenium hexafluoride, or hydrogen selenide. Next, a specific selenium mass isotope 74, 76, 77, 78, 80 or 82 is selected, whereby the specific selenium mass isotope is contained in the precursor material at a predetermined enrichment level above the natural abundance levels shown in Table 1.

After selection of the precursor containing source material, the specific Se mass isotope and the specific enrichment level, the enriched Se-based precursor dopant material is preferably introduced from a sub-atmospheric storage and delivery device 201 (FIG. 2) in gaseous form. The sub-atmospheric delivery device 201 is designed to maintain the dopant material in a pressurized state within the device 201, while minimizing or eliminating the risk of developing a leak or catastrophic rupture that is typically associated with high pressure cylinders. The device is vacuum actuated so as to allow a controlled flow of the enriched Se-based precursor dopant material to the downstream ion source chamber 100 process only when a sub-atmospheric condition is achieved along the discharge flow path of device 201. The discharge of the enriched Se-based precursor dopant material only occurs when a suitable discharge condition exists outside of the device, thereby avoiding an unintended release of the toxic material from the storage and delivery device. In this way, the present invention allows for safe and reliable handling of the toxic Se-based precursor dopant material.

The enrichment of the material allows stream 102 to be introduced at a reduced flow rate compared to its non-enriched analog, whereby the specific selenium mass isotope is enriched to a concentration greater than a concentration of the specific selenium mass isotope in a corresponding non-enriched selenium dopant precursor material. It should be understood that the term "non-enriched" as used herein and throughout the specification is used interchangeably with "natural abundance level" and is intended to mean that none of the stable Se isotopes are enriched above the natural abundance levels shown in Table 1. For instance, if the mass isotope selected for implant is $^{80}$Se, such material at the natural abundance level contains 49.82% $^{80}$Se. This means that an implantation process that requires, by way of example, a flow rate of 4 sccm for a given source material (e.g., $H_2Se$) at the natural abundance level only comprises 49.82% $^{80}$Se, while a source material with $^{80}$Se enriched to 100% would have an equivalent flow rate of 1.99 sccm to generate an equivalent amount of $^{80}$Se ions. In this example, the effective flow rate can be reduced by approximately 50% by utilizing the 100% enriched $^{80}$Se material as compared with material at natural abundance levels. Other examples are envisioned wherein various enrichment levels of various isotopes will impact the required flow of source material to achieve a given requirement of a specific selenium isotope. In this manner, the present invention allows the ability to achieve an equivalent Se ion implanted dosage utilizing reduced gas consumption in comparison to its non-enriched analog.

The ion source 100 depicted in FIG. 1 has various components, including source filament 114 and an indirectly heated cathode (IHC) 115 which serves as the ion source for ionizing the enriched Se precursor material into its corresponding Se ions. It should be understood other suitable types of ion sources known in the art can be employed, including, for example, the Freeman sources, Bernas sources and RF plasma sources.

A power supply source (not shown) resistively heats tungsten-based filament 114 positioned in close proximity to the cathode 115. The filament 114 may be negatively biased relative to the cathode 115. A current is applied to the filament 114 through the power supply source to resistively heat the filament 114. An insulator 118 is provided to electrically isolate the cathode 115 from the arc chamber wall 111. The cathode 115 maintains adequate ionization of the enriched Se precursor material to achieve the required implant dosage of Se.

Because less overall enriched Se precursor material is required to be introduced into chamber 103, cathode 115 ionizes less overall Se ions. Less overall Se ions are available for physically sputtering the ion source components, including cathode 115. Accordingly, ion source life and performance may be improved.

Still referring to FIG. 1, the emitted electrons from the cathode 115 accelerate and ionize the enriched Se precursor material to produce a plasma environment within the chamber 112. The repeller electrode 116 builds up a negative charge to repel the electrons back towards the enriched Se precursor material to collide therewith and sustain ionization of the enriched Se precursor material. In this manner, the plasma environment is maintained in the arc chamber 112 at a pressure that remains sufficient to maintain stability of the ion source 100.

Repeller electrodes 116 are preferably configured substantially diametrically opposed to the cathode 115 to maintain ionization of the enriched Se precursor material within the chamber 112. The arc chamber wall 111 includes an extraction aperture 117 through which a well defined ion beam 121 is extracted from out of the arc chamber 112. The extraction system includes extraction electrode 120 and suppression electrode 119 positioned in front of the extraction aperture 117. Both the extraction and suppression electrodes 120 and 119 have respective apertures aligned with the extraction aperture 117 for extraction of the well-defined ion beam 121.

FIG. 2 shows the ion source apparatus 100 of FIG. 1 incorporated into a beam line ion-implant system 200. The enriched Se precursor material at 55% or greater is introduced from gas box 201. The enriched Se precursor material is introduced into an ion source chamber 100 where energy is introduced into the chamber to ionize the enriched Se precursor material as has been described. Flow control device 219 which includes mass flow controllers and valves is used to control the flow of the enriched dopant gas at a reduced flow rate in comparison to its non-enriched analog.

Upon generation of the desired Se ion beam enriched in one of its stable mass isotopes, an ion beam extraction system 201 is used to extract the Se ions from the ion source chamber 113 in the form of an ion beam 121 of desired energy and beam current. Extraction can be carried out by applying a high voltage across extraction electrodes. The extracted beam 221 is transported through a mass analyzer/filter 205 to select the Se species to be implanted. The filtered ion beam 207 can then be accelerated/decelerated 206 and transported to the surface of a target workpiece 209 positioned in an end station 210 for implantation of the Se dopant atomic species into the workpiece 209. The Se ions of the beam collide with and penetrate the surface of the workpiece 209 at a specific depth to form a region with the desired electrical and physical properties.

By virtue of the reduced flow rate of the enriched Se dopant species, a reduction in waste material can be achieved. In particular, as noted in the example above, at a flow rate of 4 sccm of selenium material at the natural abundance level where the $^{80}$Se is selected for implantation, other isotopes ($^{74}$Se, $^{76}$Se, $^{77}$Se, $^{78}$Se and $^{82}$Se) account for 50.18% of the total flow. In this example, more than 50% of the flow of selenium is waste and must be collected and abated since the material is highly toxic. Abatement and subsequent waste disposal are both costly and time consuming. Therefore, reduction of this type of waste stream is environmentally sound, reduces the potential for human exposure to toxic materials and enhances sustainability.

Additionally, utilizing enriched selenium material involves reducing tool downtime and consumables costs. Unlike solid-based Se sources, Se gas-based dopant sources do not require start-up and downtime sequences, thereby allowing significant gains in productivity. The ion source in the ion implanter requires periodic maintenance, with the maintenance cycles being dependent upon the species being ionized and the quantities of those species that are introduced to the ion source. In the example above where the $^{80}$Se is selected as the desired mass isotope for implantation, an enriched material containing 100% $^{80}$Se requires ~50% of the flow rate required for selenium material at the natural abundance level. Lower flow rates of the source material into the ion source result in fewer ions depositing and/or sputtering on the walls of the ion chamber 100, the cathode 115, the anode 116 and the extraction aperture 117. Additionally, when selecting Se source materials having fluorine-containing species, etching of ion source chamber components formed from tungsten can occur and is typically problematic. However, in accordance with the principles of the present invention, the lower flow rates associated with the Se enriched precursor material can reduce such problematic etching reactions.

Accordingly, the net effect of operating the process at lower flow rates is longer times between maintenance cycles, less need for replacement of consumables ion chamber components as well as reduced safety hazards associated with personnel exposure.

The present invention contemplates any type of enriched Se-containing compound. Selection of a particular enriched Se-containing material will depend on several considerations, some of which include required beam current level and other ion source operating parameters; Se ion dosage requirements; the presence of one or more diluent gases; flow rate operating constraints; and the mode in which the ion source is running (i.e., dedicated mode versus non-dedicated mode). In one example, enriched H2Se may be utilized, and optionally in the presence of a diluent gas such as -fluoride gas or mixture thereof. Enriched H2Se reduces the amount of Se-containing deposits in comparison to Se ion implantation from naturally occurring H2Se.

In a preferred embodiment, the enriched selenium-containing material is SeF6. The enriched SeF6 can optionally be used in combination with any type of suitable hydrogen-containing gas. The working examples below show that SeF6 as the ability to surprisingly reduce Se-containing deposits to low levels such that minimal filament or cathode weight gain is realized without significant reduction to beam current levels. Enriched SeF6 reduces the amount and nature of Se-containing deposits to a noticeably greater degree than certain levels of enriched H2Se.

Although enriched SeF6 is a preferred Se-containing in accordance with the present invention, its detection can be challenging. Generally speaking, a pyrolyzer-based detection equipment has been typically used to monitor for leakage of naturally occurring SeF6 when supplied to a process such as an ion chamber. However incorporating such detection equipment onto currently used ion implant systems may need hardware modifications. Accordingly, rather than undergo complex design modifications to retrofit existing ion implant systems, the present invention contemplates utilizing hydrogen containing gases or mixtures thereof premixed with enriched SeF6 in a single source or container such as a sub-atmospheric source, whereby the hydrogen containing gas can be used as a tracer material to detect for the leakage of SeF6. For example, PH3 can be premixed with enriched SeF6, and the PH3 detector on the ion implant system can be used to detect for enriched SeF6 leaks. Other suitable tracer gases include, by way of example, hydrogen, arsine, germane or silane. Depending on the concentration and type of hydrogen-containing gas, the hydrogen-containing tracer gas may also dually serve as a diluent in the ion implantation process.

The elimination or substantial reduction of deposits when utilizing enriched SeF6 enables the ability to subsequently utilize halide-containing dopant gases without prematurely shortening the source life. The working examples (FIG. 4) surprisingly revealed that naturally occurring H2Se. Without being bound by any theory, the insubstantial Se-containing deposits created when utilizing enriched SeF6 allows the ability to subsequently transition to the use of a halide-containing dopant gas source (e.g., BF3, SiF4, and the like) without incurring a short source life. The working examples utilized SiF4 as a representative halide-containing gas that was run in the ion source chamber after completion of 80Se ion implantation utilizing enriched SeF6 in one test and naturally occurring H2Se in another test. The severity of Se-containing deposits during the Se ion implantation not only shortened its source life but detrimentally affected the ability to implant Si ions from ionization of SiF4 in the ion source chamber in subsequent ion implantations.

In another embodiment of the present invention, the enriched selenium containing source material can be sequentially flowed or co-flowed with one or more materials to facilitate in-situ cleaning of the ion source during operation. The in-situ cleaning materials may include but are not limited to $H_2$, Xe, Ar, Kr, Ne, $N_2$ and mixtures thereof, as well as fluorinated substances such as $CF_4$, $C_2F_6$ and the like. The cleaning source material may be introduced as a separate source entering the ion chamber 103, may be mixed with the selenium source material prior to introduction into the ion chamber 103 or may be provided as in a pre-mixed state with the selenium source material within sub-atmospheric storage and delivery device 201 of FIG. 2. An example of the pre-mixed material would be a cylinder package containing a mixture of hydrogen and hydrogen selenide ($H_2$Se), isotopically enriched above natural abundance levels in one of its stable mass isotopes. Other co-flow material mixtures with enriched selenium are also contemplated by the present invention. Any mixing ratio of enriched selenium containing source material to co-flow material may be used, depending, at least in part, upon the specific selenium implant process conditions.

The enriched selenium-containing dopant composition is provided in the gas phase, thereby eliminating the need to store and deliver from a vaporizer. In a preferred embodiment, the supply of the enriched selenium containing source material is provided by a sub-atmospheric delivery and storage device that maintains the enriched selenium dopant containing gas source material in a pressurized state within an interior volume of the device. The selenium dopant containing source material is preferably in a gaseous phase and enriched in one of its naturally occurring mass isotopes. The delivery device is in fluid communication with a discharge flow path, wherein said delivery device is actuated to allow a controlled flow of the enriched selenium dopant containing gas source material from the interior volume of the device in response to a sub-atmospheric condition achieved along the discharge flow path.

Preferably, the delivery device is actuated under vacuum conditions. Such a vacuum actuated delivery device is preferably disposed entirely within a storage container or cylinder. Various mechanical designs can be employed to achieve sub-atmospheric delivery of the enriched selenium dopant containing gas source material. In a preferred embodiment, the Uptime® delivery device, sold by Praxair® and as disclosed in U.S. Pat. Nos. 5,937,895; 6,045,115; 6,007,609; 7,708,028; and 7,905,247, all of which are incorporated herein by reference in their entirety, may be employed in the present invention to safely deliver a controlled flow rate of the enriched selenium dopant containing gas source material to an ion apparatus for selenium implantation. The device comprises a port body for communication with the outlet of a pressurized cylinder. A movable valve element is configured to move between a sealing position and an open position. In the sealing position, the valve element blocks the flow of the pressurized enriched selenium dopant containing gas source material from the interior of the cylinder. An expandable diaphragm located downstream of the valve element is operably linked with the valve element for controlling movement of the valve element in a manner that retains the valve element in the sealing position until a pressure differential between the inside and outside of the diaphragm occurs. The diaphragm is sealed at atmospheric pressure or greater, and in communication with the fluid discharge path. Accordingly, when the pressure condition outside the diaphragm attains a sub-atmospheric condition, the diaphragm attains a pressure differential between its interior and outside which causes the diaphragm to expand and move the valve element to the open configuration which creates a flow path for the enriched selenium dopant containing gas source material to flow from the cylinder through the fluid discharge line and into the ion apparatus where selenium implantation can occur. A flow restrictor can be affixed to the valve element to further control and limit the flow of the enriched selenium dopant containing gas source material from the cylinder. Advantageously, external pressure regulators are not required for reducing the cylinder pressure to pressures acceptable for mass flow controllers utilized along the fluid discharge line.

The above check valve arrangement can be set to reliably prevent opening of the valve element until pressure along the fluid discharge path drops to a vacuum condition. Because the typical end-user's ion apparatus operates at sub-atmospheric pressures of 100 torr or less, dispensing the enriched selenium dopant containing gas source material at a vacuum at pressures of, for example, 500 torr or less ensures that any leaks only leak into the ion apparatus where they can be quickly detected. As a result, the ion implantation process utilizing the sub-atmospheric delivery device for delivering enriched selenium dopant containing gas source material does not require validating the absence of leaks.

Other suitable sub-atmospheric delivery devices may include pressure regulators, check valves, excess flow valves and restrictive flow orifices in various arrangements. For example, two pressure regulators may be disposed in series within the cylinder to regulate the cylinder pressure of enriched selenium dopant containing gas source material to a predetermined pressure acceptable for downstream mass flow controllers contained along the fluid discharge line.

One skilled in the art will recognize additional benefits available through the use of enriched selenium and that the enrichment is not limited to $^{80}$Se, but could include enrichment of any of the other naturally occurring isotopes. Additionally, the enrichment levels may range from any value above the naturally occurring abundance level up to and including 100%.

COMPARATIVE EXAMPLE 1

SiF4 Without Prior Se Ion Implantation

Figure 4:
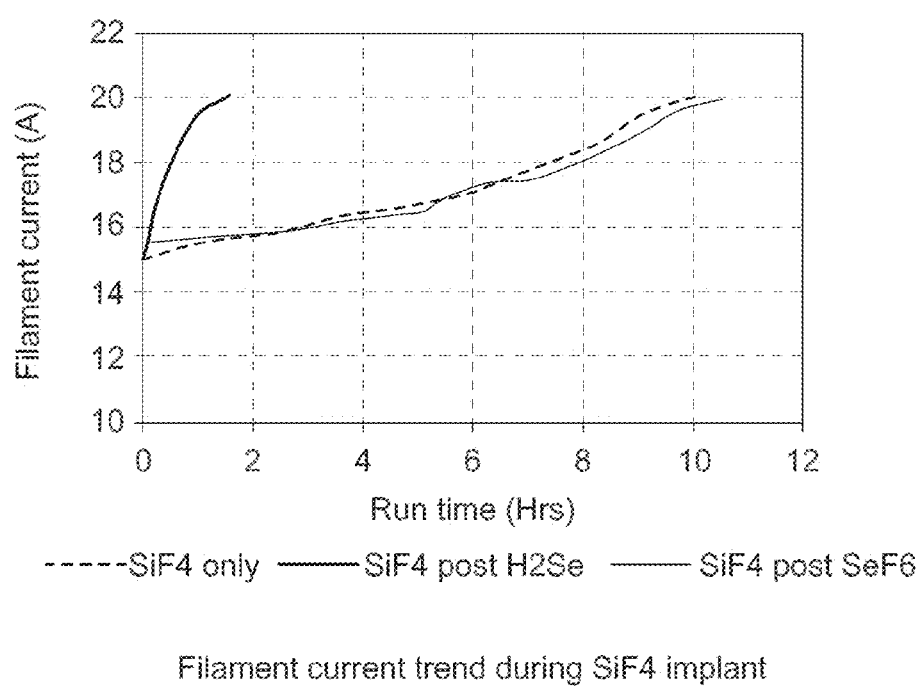
FIG. 4 is a graphical comparison of the effects of Si ion implantation when previously implanting Se utilizing naturally occurring H2Se and enriched SeF6.

As a baseline test, SiF4 was run in an ion source chamber without having previously implanted Se in the ion source chamber. The filament current as a function of time was monitored, and the results are shown in FIG. 4. The dotted line designated "SiF4 only" shows the filament current trend during Si ion implantation without any prior Se implantation. It was observed that filament current steadily increases to 20 A in approximately 10 hours. During the Si ion implantation with SiF4, W from the arc chamber wall was etched via F ions and radicals and redeposited onto the hot filament. This gradually reduced electron emission efficiency of the filament and, as a result, higher current was required to maintain the generation of sufficient electrons to sustain the plasma over the course of the test run.

COMPARATIVE EXAMPLE 2

Naturally Occurring H$_2$Se

Figures 3A, 3B:
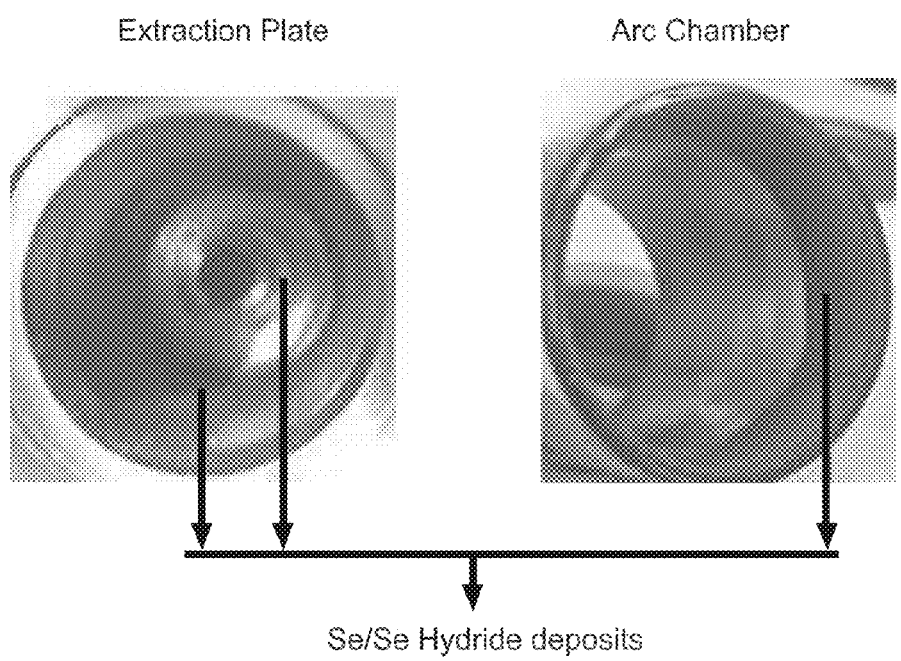
FIGS. 3a and 3b show the nature of deposits accumulating on various components of the ion source chamber when utilizing naturally occurring H2Se as the dopant gas source for Se ion implantation.

Experiments were conducted to evaluate ion source performance during Se ion implantation utilizing H$_2$Se as the dopant gas source. 80Se was chosen as the desired mass isotope for ion implantation due to being present as the most abundant mass isotope in naturally occurring Se as shown in Table 1. It was observed that H2Se based process generated sufficient 80Se+ ions desired for high dose Se implant application. However, it was also observed that during the course of operation Se containing deposits were formed in the ion source region including the arc chamber (FIG. 3b) and extraction plate (FIG. 3a), which is situated in front of the arc chamber. Substantial Se containing deposits caused significant weight gain.

After completion of 80Se ion implantation utilizing H$_2$Se, Si ion implantation utilizing SiF4 was run in the same ion source chamber. In comparison to Comparative Example 1, it was observed that the filament reduced its electron emission efficiency at a faster rate, thereby causing the filament current to be increased at a faster rate to sustain the plasma. The filament current hit an upper value of 20 A in approximately 1.5 hours. The implantation process needed to be aborted, as the filament was not able to maintain the generation of a sufficient amount of electrons to sustain the plasma in the chamber. It was observed that during the Si implantation, deposited Se was etched at a rapid rate from the arc chamber and nearby ion source region and then re-deposited on the filament. The premature failure of Si ion source effect is illustrated in FIG. 4 by the curve labeled "SiF4 post H2Se". The results indicated that the Si ion implantation was severely impacted by the previous 80Se ion implantation process which utilized naturally occurring H2Se.

EXAMPLE 1

Enriched SeF6

Figures 5A, 5B:
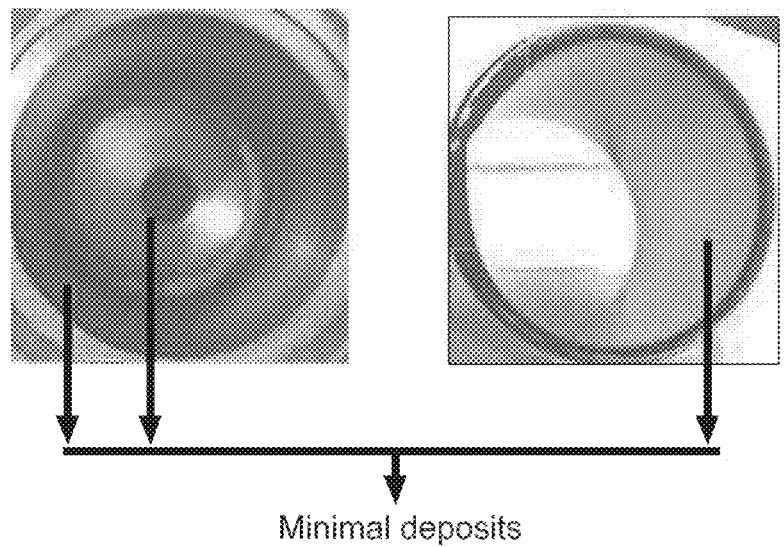
FIGS. 5a and 5b show the nature of deposits accumulating on various components of the ion source chamber when utilizing enriched SeF6 as the dopant gas source for Se ion implantation.

Experiments were conducted to evaluate ion source performance during Se ion implantation utilizing enriched SeF6 as the dopant gas source in combination with co-flowing a mixture of xenon and hydrogen. Enriched SeF6 was enriched in 80 AMU Se to levels >90%. 80Se was chosen as the desired mass isotope for ion implantation. Enriched 80SeF6 generated 80Se+ ions that allowed the implanting a high dosage of 80Se ions at sufficient beam current levels which were comparable to H2Se (Comparative Example 1). Unlike H2Se (Comparative Example 1), ionization of SeF6 did not generate significant Se containing deposits in the ion source regions of the extraction plate (FIG. 5a) and the arc chamber (FIG. 5b). FIGS. 5a and 5b show minimal deposits, which did not affect the test run. The fluorine ions, which were generated upon ionization of SeF6, etched the W components from the arc chamber wall. However, the etching was effectively mitigated and controlled by simultaneously flowing the xenon and hydrogen gas with SeF6. Minimal deposits caused marginal weight gain of the filament.

Next, Si ion implantation was run utilizing SiF4 in the same ion chamber. Unlike the post H2Se scenario (Comparative Example 2), no reduction in ion source life was observed. The filament current trend was observed to be similar to the trend observed from the baseline SiF4 process without any prior Se implant (Comparative Example 1). The results are illustrated in FIG. 4 by the curve labeled "SiF4 post enriched SeF6". The results indicated that the Si ion implantation was not impacted by the previous 80Se ion implantation process which utilized enriched SeF6.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A method for implanting selenium, comprising:
    selecting an enriched selenium-based dopant precursor material, said material having a plurality of selenium mass isotopes;
    selecting a specific selenium mass isotope from the plurality of selenium mass isotopes, said specific selenium mass isotope contained in the precursor material at an enrichment level above natural abundance levels;
    providing the enriched selenium-based dopant precursor material in a storage and delivery container, said container being compatible with the selected enriched selenium-based dopant precursor;
    withdrawing the enriched selenium-based dopant precursor material in a gaseous phase from the storage and delivery container;
    flowing the material at a predetermined flow to an ion source;
    ionizing the enriched selenium-based dopant precursor material to produce ions of the specific selenium mass isotope;
    extracting the ionized specific selenium mass isotope from the ion source;
    implanting the ionized specific selenium mass isotope into a substrate;
    wherein the specific selenium mass isotope is enriched to a concentration greater than a concentration of the specific selenium mass isotope in a corresponding natural abundance selenium dopant precursor material, thereby allowing the predetermined flow rate of the enriched selenium-based dopant precursor material to be less than a corresponding flow rate of a natural abundance selenium-based dopant precursor material.

2. The method of claim 1, wherein the enriched selenium-based dopant precursor is selected from the group consisting of metallic selenium, selenium oxide, selenium hexafluoride, hydrogen selenide and combinations thereof.

3. The method of claim 2, wherein the enriched selenium-based dopant precursor is hydrogen selenide.

4. The method of claim 1, wherein the predetermined flow rate of the enriched selenium-based dopant precursor is less than a flow rate of a non-enriched selenium compound.

5. The method of claim 3, wherein the enriched hydrogen selenide comprises mass 80 selenium isotope is in an enriched concentration greater than naturally occurring levels.

6. The method of claim 1, wherein the enriched selenium-based dopant precursor material is enriched in the specific selenium mass isotope at least 10% above natural abundance levels.

7. The method of claim 1, wherein the enrichment level is 50% above natural abundance levels.

8. The method of claim 2, wherein the enriched selenium-based dopant precursor material is selenium hexafluoride enriched in one of the selenium isotopes at about 10% or greater.

9. The method of claim 8, wherein the enriched selenium hexafluoride is flowed to the ion source with a diluent, said diluent being co-flowed or sequentially flowed with the enriched selenium-based dopant precursor material.

10. The method of claim 8, further comprising withdrawing the enriched selenium hexafluoride from the storage and delivery container, wherein said container is a sub-atmospheric delivery dispensing system.

11. The method of claim 8, wherein a halide-containing dopant gas is introduced into the ion source chamber after implanting the ionized specific selenium mass isotope from the enriched selenium hexafluoride.

12. The method of claim 9, wherein the diluent comprises a hydride.

13. A source supply for a selenium-based dopant gas composition comprising:
    gaseous selenium dopant containing gas source material enriched in one of its naturally occurring mass isotopes; and
    a sub-atmospheric delivery and storage device for maintaining the enriched selenium dopant containing gas source material in a pressurized state within an interior volume of the device, said delivery device in fluid communication with a discharge flow path, wherein said delivery device is actuated to allow a controlled flow of the enriched selenium dopant containing gas source material from the interior volume of the device in response to a sub-atmospheric condition achieved along the discharge flow path.

14. The source supply of claim 13 where the selenium dopant gas source is enriched selenium hexafluoride.

15. The source supply of claim 13, further comprising a diluent or tracer gas premixed with the selenium dopant containing gas in the sub-atmospheric delivery and storage device.

16. The source supply of claim 15, further comprising a diluent wherein said diluent gas is selected from the group consisting of $H_2$, Xe, Ar, Kr, Ne, $N_2$, PH3 and mixtures thereof.

17. The source supply of claim 15, further comprising a tracer gas selected from the group consisting of phosphine, hydrogen, arsine, germane and silane.

18. The source supply of claim 13, further comprising a secondary sub-atmospheric storage and delivery device, said secondary sub-atmospheric storage and delivery device comprising a diluent or tracer gas.

19. A selenium-containing dopant composition for use in an ion implantation process, comprising:
    a selenium-containing dopant gas source material enriched in one of its naturally occurring mass isotopes to a concentration greater than a concentration of the specific selenium mass isotope in a corresponding natural abundance selenium dopant precursor material, wherein said selenium-containing material is stored and delivered in the gas phase, thereby characterized by an absence of storage and delivery from a vaporizer.

20. The selenium-containing dopant composition of claim 19, selected from the group consisting of metallic selenium, selenium oxide, selenium hexafluoride, hydrogen selenide and combinations thereof.

21. The selenium-containing dopant composition of claim 19, comprising selenium hexafluoride.

22. The selenium-containing dopant composition of claim 21, further comprising a tracer or diluent material.

* * * * *